United States Patent [19]

Jin et al.

[11] Patent Number: 5,509,815

[45] Date of Patent: Apr. 23, 1996

[54] SOLDER MEDIUM FOR CIRCUIT INTERCONNECTION

[75] Inventors: Sungho Jin, Millington; Mark T. McCormack, Summit, both of N.J.

[73] Assignee: AT&T Corp., Murray Hill, N.J.

[21] Appl. No.: 255,687

[22] Filed: Jun. 8, 1994

[51] Int. Cl.⁶ .................................................. H01R 9/09
[52] U.S. Cl. ...................... 439/91; 228/56.3; 228/180.22
[58] Field of Search ........................... 228/56.3, 180.22, 228/248.5; 439/91; 72/255

[56] References Cited

U.S. PATENT DOCUMENTS

| | | | |
|---|---|---|---|
| 4,003,621 | 1/1977 | Lamp | 439/586 |
| 4,644,101 | 2/1987 | Jin et al. | 178/18 |
| 4,705,205 | 11/1987 | Allen et al. | 439/91 X |
| 4,737,112 | 4/1988 | Jin et al. | 439/66 |
| 4,820,376 | 4/1989 | Lambert et al. | 439/91 X |
| 4,949,455 | 8/1990 | Nakamura et al. | 228/56.3 X |
| 5,045,249 | 9/1991 | Jin et al. | 439/91 X |

OTHER PUBLICATIONS

S. Jin et al., "New, Z–Direction Anisotropically Conductive Composites," Journal of Applied Physics, vol. 64, No. 10, Part II, 15 Nov. 1988, pp. 6008–6010. Cited in application; technological background of the invention.

S. Jin et al., "Anisotropically Conductive Polymer Films With A Uniform Dispersion of Particles," IEEE Transactions on Components, Hybrids, and Manufacturing Technology, vol. 16, No. 8, Dec. 1993, pp. 972–977. Technological background of the invention.

Primary Examiner—Kenneth J. Ramsey
Attorney, Agent, or Firm—Oleg E. Alber; Dexter K. Chin

[57] ABSTRACT

Electronic devices having at least two components wire mating contact pads are provided with high-aspect-ratio solder joints between the mating pads. These joints ar formed by placing a composite solder medium containing solder wires in an electrically insulating matrix such that at least two solder wires are in contact with the mating pads, and fusing the wires to the pads. The insulating matrix with remainder of solder wires is then optionally removed from between the said at least two component. The composite solder medium is formed by preparing an elongated body of solder wires in an insulating matrix and cutting off slices of the composite solder medium, the solder wires having a high-aspect-ratio of length to the diameter. Alternatively sheets of the composite solder medium are prepared by magnetically aligning solder coated magnetic particles into columns arranged transverse of an insulating matrix and heating sufficiently to fuse the solder in each column into a continuously conducting solder path.

47 Claims, 5 Drawing Sheets

SOLDER MEDIUM FOR CIRCUIT INTERCONNECTION

FIELD OF THE INVENTION

This invention relates to solder medium for connecting electronic circuits and devices.

BACKGROUND OF THE INVENTION

Modern electronic products including computers, telecommunication equipment, automobile electronics, and consumer electronics require circuit interconnection. The off-chip circuit interconnection and packaging is typically made with solder joints, either by wave soldering or surface mounting technique, as is well known in the art. An increase in circuit interconnection density is desirable for lowering the device cost as well as for miniaturizing the electronic products, which has been the general trend in recent years.

In high or ultra-high density circuit connections, the size of the interconnection contact pads and hence the size, especially the height of solder joints on them, is drastically reduced. As a result, the shear strain which is related to the ratio of the lateral change in substrate dimension (e.g., caused by thermal expansion mismatch) over the solder joint height and accompanying stress on solder are significantly increased. In the widely-used eutectic Pb-Sn solder, it is well known that the solder joint failure by fatigue is caused by the combination of cyclic temperature change and extensive plastic shear strain which in turn causes microstructural coarsening and crack initiation. If the solder joints had high-aspect ratios and were elastically compliant, their elastic bending could have accommodated some of the strain and minimized the amount of plastic strain on solder. However, most present-day solder joints are relatively short (e.g. spherical segment geometry) and, hence, deform plastically with little elastic compliance. In view of these considerations, there is a need for improved solder joint geometry to reduce the shear strain and to enhance the joint reliability during the service of electronic products.

SUMMARY OF THE INVENTION

Electronic devices having at least two components with mating contact pads are provided with high-aspect-ratio solder joints between the mating pads. These joints ar formed by placing a composite solder medium containing solder wires in an electrically insulating matrix such that at least two solder wires are in contact with the mating pads, and fusing the wires to the pads. The insulating matrix with remainder of solder wires is then optionally removed from between the said at least two components. The composite solder medium is formed by preparing an elongated body of solder wires in an insulating matrix and cutting off slices of the composite solder medium, the solder wires having a high-aspect-ratio of length to their diameter. Alternatively sheets of the composite solder medium are prepared by magnetically aligning solder coated magnetic particles into columns arranged transverse of an insulating matrix and heating sufficiently to fuse the solder in each column into a continuously conducting solder path.

DETAILED DESCRIPTION

Figure 1:
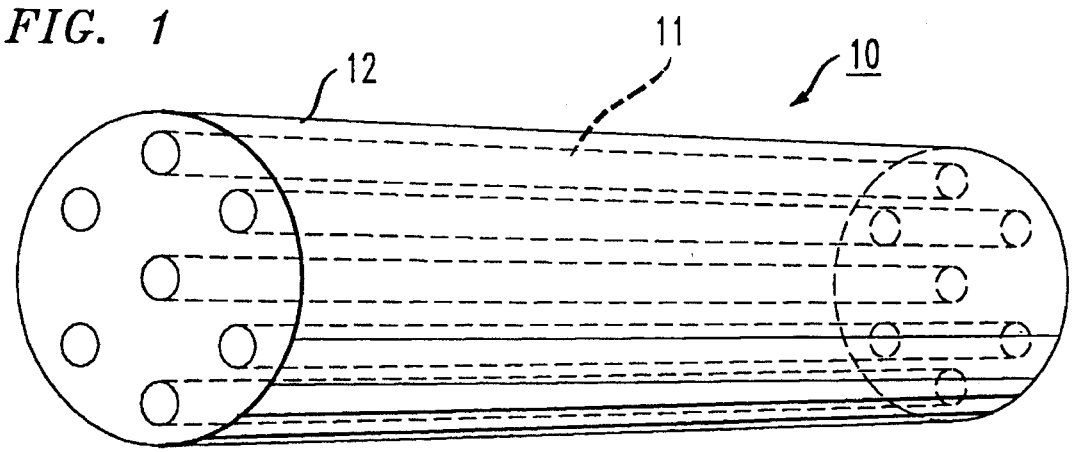
FIG. 1 is a schematic illustration of a composite solder medium containing solder wires coated with compliant or dissolvable carrier matrix.

This invention concerns solder-containing composite medium and soldering method using the composite medium that will allow formation in electronic devices of high-aspect-ratio solder joints for improved reliability. One exemplary embodiment of the invention is to create a high-aspect-ratio solder-containing composite medium by embedding solder wires, rods or ribbons in an electrically insulating plastically deformable matrix and then slicing the composite medium cross-sectionally to obtain the high-aspect-ratio interconnection medium with desirable height. The matrix is of a material which is either elastically compliant or can be dissolved away after interconnection. In order to achieve a relatively uniform spacing between the solder wires, a bunch of wires, 11, is coated with an electrically insulating medium, 12, e.g., by dip coating or continuously pulling through a bath of an insulating medium in a liquid form, and curing, semicuring or drying the medium forming a coated bunch, 10, as schematically shown in FIG. 1. Thereafter coated bunch 10 is drawn out into an elongated form, 20, to reduce the diameter of the wires to a desired solder wire diameter. Alternatively, a number of individual coated wires or coated bunches 10 are bundled together with additional matrix liquid, and cured or dryed to obtain a large cross-section composite medium. This large composite medium is then drawn out into elongated form 20 having wires, 21, with a desired solder wire diameter within a matrix material, 22. This procedure may be repeated until the diameter of wires 21 is reduced to a size of 50 μm or less, preferably less than 10 μm.

Figure 2:
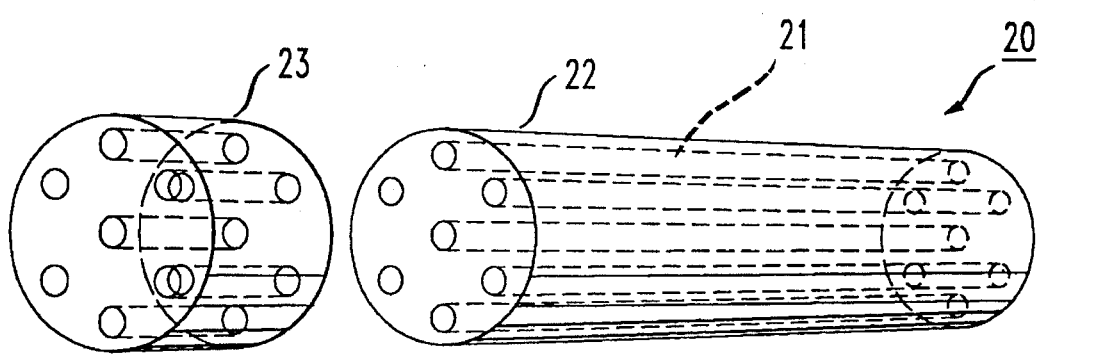
FIG. 2 is a schematic illustration of a longitudinally drawn composite solder medium containing the solder wires and compliant or dissolvable carrier matrix, and of a thin slice of the composite cut-off from the elongated composite.

The drawn-out composite 20 is then sliced, e.g. by razor-sharp blade or knife, or any other cutting instruments, into thin wafers or sheets, 23, as shown in FIG. 2. Solder wires are typically mechanically soft and are easily cut by razor blade. The cutting can be optionally carried out at a slightly elevated temperature (e.g. 50°–150° C.) to utilize the extreme softness of solders at these temperatures.

Figure 6:
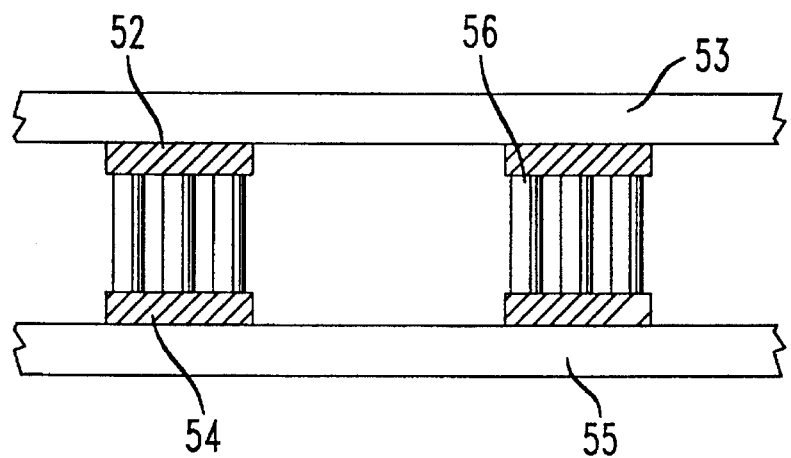
FIG. 6 is a schematic cross-sectional view of the electronic device shown in FIG. 5 but in which the carrier matrix is dissolved away after soldering operation.

The insulating medium in the composite is desirably mechanically much more softer elastically and plastically than the solder so that the presence of the medium does not exert any excessive stresses on solder during device service, e.g., by thermal expansion mismatch. Exemplary compliant media include elastomers and plastics, such as polyurethanes. Alternatively, instead of the compliant medium, a dissolvable medium can be used, for example, gelatine-, glucose-,fructose-, or honey-based materials, or polyvinyl alcohol, polyacrylamide, polyvinyl pyrrolidinone type organic polymers that are water soluble, or buthylvinyl alcohol, polyvinyl acetate type materials that are soluble in solvent such as toluene or acetone. Optional additional materials and fillers may be added for various purposes such as viscosity control, plasticizing, etc., for example fine silica or alumina particles. The dissolvable medium is maintained as a solid throughout the stages of slicing of the composite, and subsequent soldering interconnection process, but is dissolved away after soldering is completed, as shown in FIG. 6, so that each of the vertical columns of high-aspect-ratio solder in the joint can be flexible without mechanical constraints between them.

Figure 3:
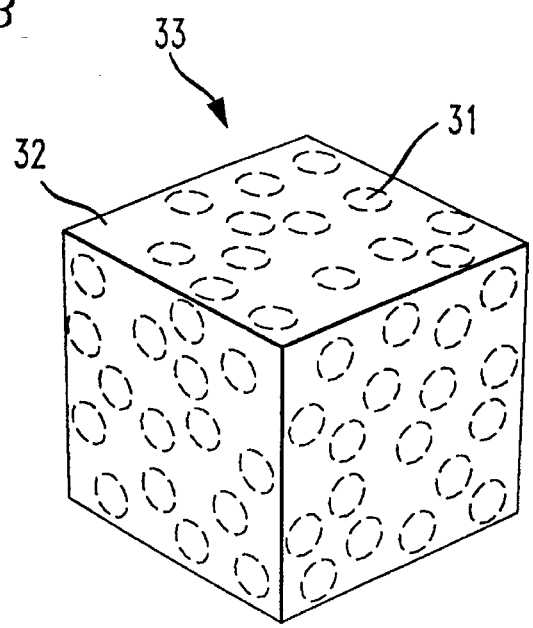
FIG. 3 is a schematic illustration of a composite solder medium containing solder particles embedded in an electrically-insulating, plastically-deformable carrier matrix.
Figure 4:
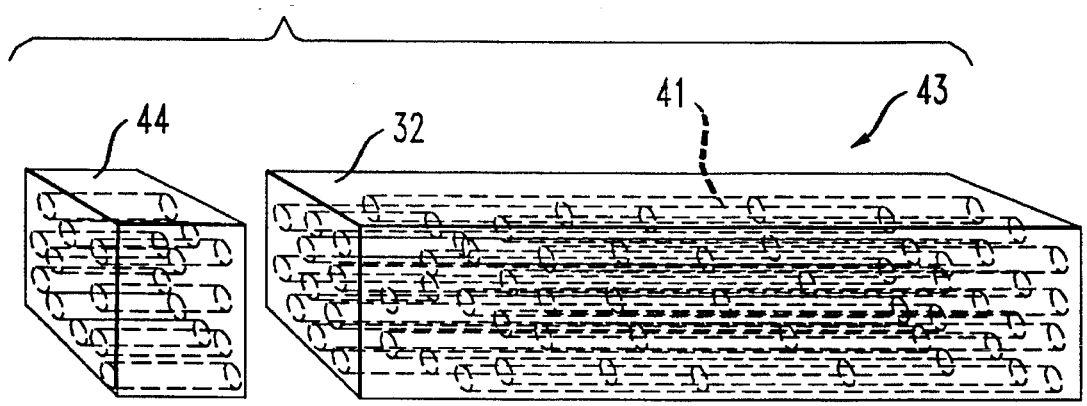
FIG. 4 is a schematic illustration of the composite solder medium of FIG. 3 after the composite solder medium and solder particles are longitudinally deformed and elongated, and of a thin slice of the composite solder medium cut-off from the elongated composite.

Another way of creating the high-aspect-ratio solder-containing composite medium is to use solder particles, 31, dispersed in a plastically deformable matrix, 32, e.g. thermoplastic polymer, plasticized rubber, clay type material with appropriate mechanical strength forming a composite structure, 33. Heat-softenable glass, salt or ceramic material may also be used, but these rigid materials are less preferable unless they are easily dissolvable. Composite structure, 33, shown schematically in FIG. 3 is then extruded (or rolled), into an elongated structure, 43, so that the embedded solder particles become elongated into "wires " (or ribbons), 41, as shown in FIG. 4. It is desirable that the mechanical strengths of the solder and the matrix medium are properly matched by choice of materials and/or the choice of processing temperatures, for example, so that the matrix is mechanically comparable to or slightly stronger than the embedded solder in order to achieve the elongation effect during extrusion. The mechanical softness of the solder can be significantly increased if necessary by carrying out the deformation at a higher temperature, e.g., close to or even above the solder melting temperature which is typically in the range of 100°–250° C. depending on the solder alloys. The extruded composite with the elongated solder is then sliced to a thin slice or sheet configuration, 44, for interconnection use.

The final diameter and density of the elongated solder wires in the composite depend on the initial size and volume fraction of the particles in the precursor composite of FIG. 3 as well as the amount of deformation by extrusion or rod drawing. The use of the particle-shaped solder in the precursor is more advantageous than the use of wire-shaped solder since fine solder particles of 20–40 μm diameter are commercially available more easily than the wire-shaped solder of similar diameter, and can also be present in a random distribution manner without the need for wire alignment, thus, allowing the production of small diameter wire structure by deformation with less complicated processing. If a 20 inch square composite, e.g., 33, containing 30% by volume of 25 μm diameter solder particles is extruded into a final shape of 2 inches square in cross-section, the average elongated particle diameter is about 2.5 μm and its length ~1670 μm. When sliced into sheets and used for interconnection of 1 mil×1 mil contact pads, the number of parallel conduction paths (the number of high-aspect-ratio solder wires) per pad is more than 30. For the slice thickness of ~10 mil (~250 μm), the length to diameter aspect ratio of the solder wires in the slice is about 100: 1. A similar analogy about the diameter deformation ratio is applicable to the wire-containing structures shown in FIGS. 1 and 2 of the drawings.

The preferred range of the slice thickness, such as for slices 23 or 44 shown in FIGS. 2 and 4, respectively, is 1–500 mil and more preferably 5–100 mil. The preferred aspect-ratio of the solder wires on the interconnected devices is at least 2 and preferably at least 4 and even more preferably at least 8. The number of parallel conduction paths in the solder joints is at least 2 per contact pad and preferably at least 4. The diameter of each of the elongated solder wires is preferably less than 50 gm and most preferably less than 10 μm. This is accomplished by repeated elongation deformation of the composite containing solder particles or wires and bundling the resultant wires or rods followed by additional deformation. This process may continue until the final composite form includes wires only a few nanometers thick. The processing or handling of fine wires with diameter less than about 100 nanometers has to be conducted very carefully, desirably in an oxygen-free atmosphere, as they could be pyrophoric.

Figure 5:
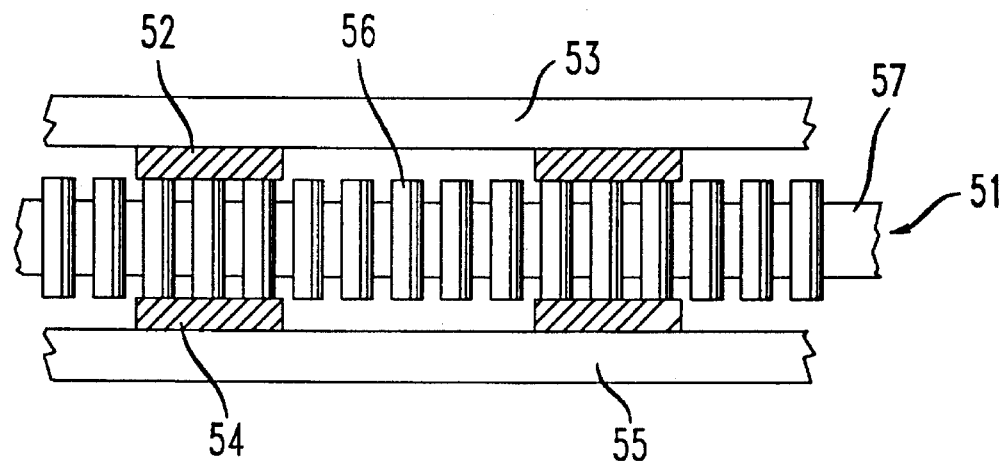
FIG. 5 is a schematic cross-sectional view of a portion of an electronic device with a thin slice of the composite solder medium of FIG. 2 or FIG.4 positioned between circuit components of the device for solder interconnection.

The slices of the composite medium are then placed between the mating pad surfaces of devices to be interconnected, and soldered, as shown in FIGS. 5 and 6. As is shown in FIG. 5, a slice, 51, of the composite solder medium, such as slice 23 or 44 shown in FIGS. 2 and 4, respectively, is placed between contact pads, 52, of circuit component, 53, and contact pads, 54, of another circuit component or mother board, 55. Solder slice 51, includes solder wires, 56, embedded in the compliant medium or matrix, 57. Appropriate flux may be used to improve the solder wetting.

The as-sliced composite solder of FIG. 2 or FIG. 4 has its matrix surface flush with the cut ends of solder wires, rods, or ribbons. This configuration is not always amenable to easy soldering operation. Therefore, it is desirable to make the ends of the solder wires to protrude, e.g., by slight dissolution of the surface of the matrix if it is made up of dissolvable material, or by addition of solder material onto the exposed ends of the solder wires in the sliced sheet, e.g. by electroplating, electroless plating of solder, or dip-coating in a molten solder bath similarly as in wave soldering, so that the ends of wires, 56, protrude above the surface of the compliant medium or matrix. During the interconnection soldering of the mating devices, the protruding solder will melt and either completely wet the mating surfaces of contact pads, 52 and 54, if the molten solder wetting contact angle is low (e.g., 37Pb-63Sn eutectic solder on Cu surface or 87Sn-8Zn-5In solder on Au-finish surface) or only partially wet the surfaces of these pads if the contact angle is high (e.g., Sn-Zn-In solder on Cu surface). The degree of desired wetting is adjustable by proper choice of solder, pad surface, flux and other parameters.

The subdivided nature of the solder material on each soldering pad is an added beneficial feature. The thin elongated solder geometry allows easier elastic bending than thicker solder joint, and induces a stress state close to plain-stress condition than a plain-strain condition so that higher fracture toughness is exhibited by the solder material. The fact that there are multiple paths for electrical conduction is an added advantage in that the chance of catastrophic failure (no electrical conduction) by the mechanical fracture of the solder joint is minimized. This is especially important for area-array solder interconnection of mating devices where the inspection or repair of solder joints is rather difficult.

Yet another way of creating the high-aspect-ratio solder-containing medium is by using magnetic field alignment in combination with solder-particle fusion. As reported by S. Jin et al in *J. Appl. Physics*, Vol. 64, p. 6008 (1988), the use of vertical magnetic field creates a laterally-separated, vertical chain-of-sphere arrangement of magnetic particles in a viscous matrix. By coating magnetic particles, 71, see FIG. 7 with solder, mixing solder-coated magnetic particles, 72, with either compliant or dissolvable liquid matrix material, 73, exposing the mixture to a magnetic field and solidifying, curing or semicuring the matrix liquid, a structure, 74, (schematically illustrated in FIG. 7) is obtained. This structure provides an anisotropic, z-direction-only electrical conductivity with in-plane isolation. In order to minimize lateral shorting, the volume fraction of the particles in the matrix is kept preferably less than 40% and even more preferably less than 25%. The solder coating is applied to magnetic particles, such as iron, nickel, cobalt, iron-nickel alloys, or conductor-coated soft ferrite particles, such as to produce a solder-to-iron volume ratio sufficient upon fusion to form a self-supporting solder column. For example, 5 μm thick electroless coating of solder on 7 μm diameter iron particles gives a solder-to-iron volume ratio of about 4:1.

Figure 7:
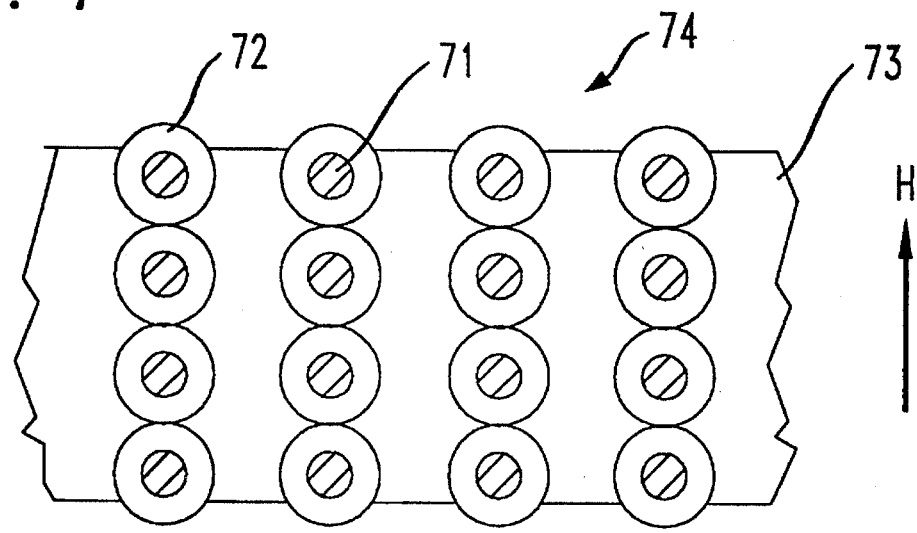
FIG. 7 is a schematic cross-sectional view of a composite solder medium containing magnetically aligned solder-coated magnetic particles in an insulating matrix.
Figure 8:
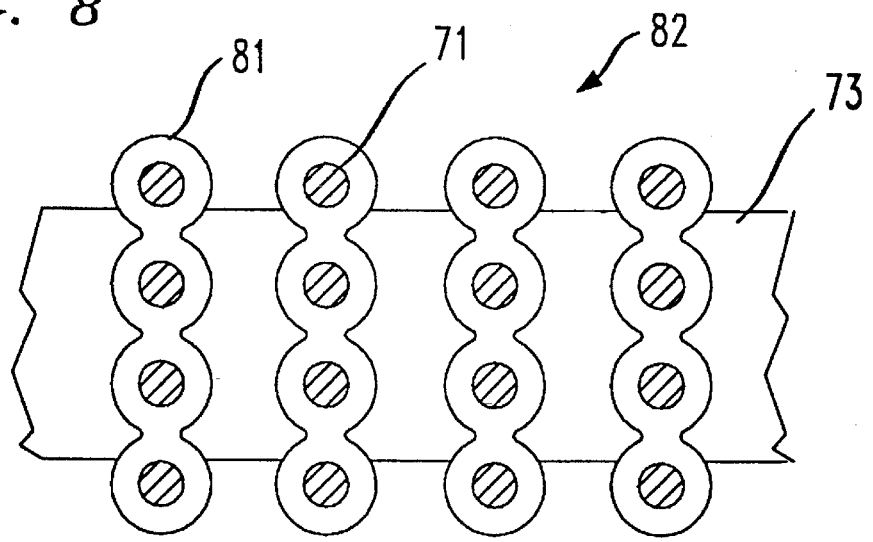
FIG. 8 is schematic cross-sectional view of the composite solder medium shown in FIG. 7 after the solder is fused together.

The composite structure of FIG. 7 does not provide continuous high-aspect-ratio solder conduits since the vertically arranged solder particles are only in physical contact. Therefore, the composite structure is heated to either melt or diffusionally sinter the solder particles so that they are fused into a high-aspect-ratio configuration, 81, as illustrated in FIG. 8. This process of fusion can be accelerated by optionally applying compressive pressure (e.g. by weight) or high vertical magnetic field that will try to bring the core magnetic particles closer. After the fusion process, optionally part of the matrix material may be dissolved away forming a fused structure, 82, or alternatively more solder may be added to the ends of each vertical column to make them protrude beyond the matrix surface for easier soldering onto the devices, as discussed earlier. Electroplating or dip-coating in a molten solder bath (such as used in wave soldering) can be utilized for this purpose. The density of individual magnetically aligned solder paths is selected similarly to that in the case of solder wires. Namely, there should be at least two solder paths per pad.

Figure 9:
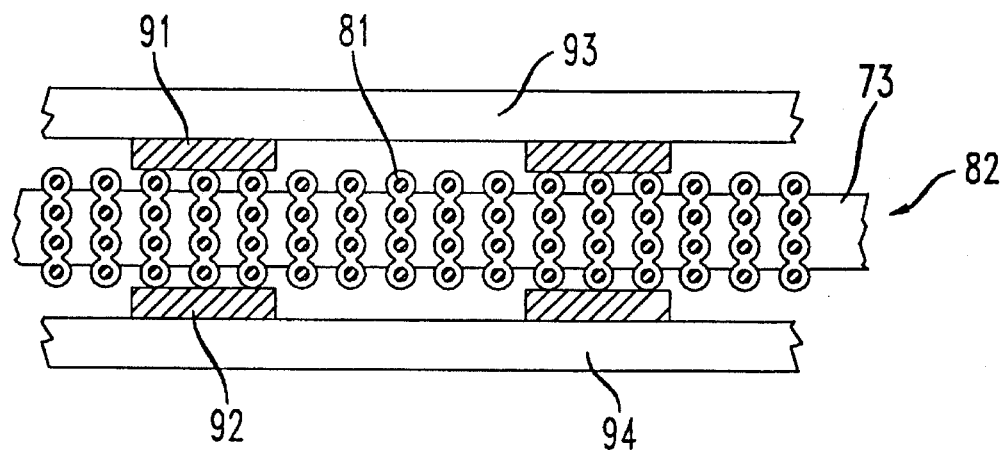
FIG. 9 is a cross-sectional view of circuit interconnection using the composite solder medium of FIG. 8.
Figure 10:
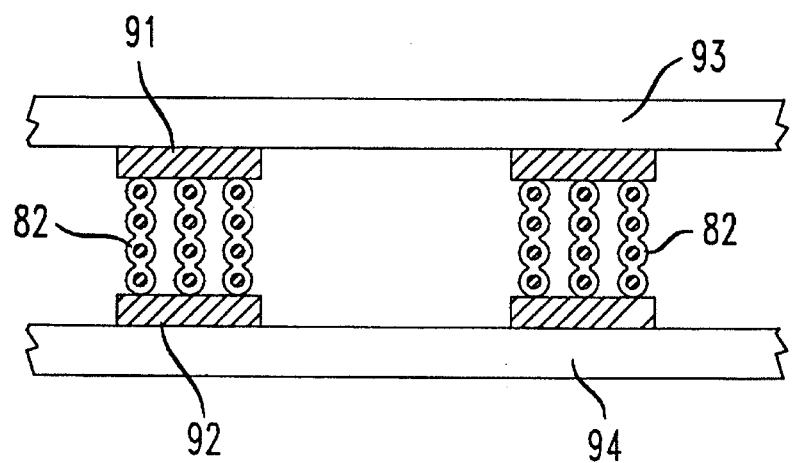
FIG. 10 is a cross-sectional view similar to FIG. 9 but in which the matrix material is dissolved away after the soldering operation.

Fused structure 82 is then placed between pads, 91 and 92, of mating devices, 93 and 94, respectively, and solder interconnected as illustrated in FIGS. 9 and 10, using a flux if desired to promote surface wetting. The matrix material can be left on if compliant (such as elastomer), or can be removed if it is dissolvable (such as gelatine), leaving a high-aspect-ratio solder structure shown in FIG. 10.

Additional advantages and modifications will readily occur to those skilled in the art. Therefore, the invention is not limited, in its broader aspects, to the specific details, representative devices, and illustrated examples shown and described. Accordingly, various modifications may be made without departing from the spirit and scope of the general inventive concept as defined by the appended claims and their equivalents. An example of such modification is the use of the high-aspect-ratio interconnection, such as shown in FIG. 6 or 10 of the drawings, as a regular solder interconnection. In such a case, the solder wires or fused structures are further fused or collapsed after the matrix is removed to form the interconnection. For such use, the aspect ratio of the wire does not need to be as high as in the multiple wire path interconnection. Also, the high-aspect ratio interconnections may be used for construction of multilayer or multi-step interconnected structures utilizing various heights of the inventive medium. For example, chips may be attached in a mother board with a 20 mil solder joint height and then the mother board may be interconnected to another board by a higher, e.g. 100 mil high, solder joints.

We claim:

1. An electronic device comprising a pair of components with mating contact pads, said contact pads being in juxtaposed alignment each to another, and mating solder joints electrically and mechanically interconnecting said mating contact pads, wherein each of said solder joints is a high-aspect-ratio subdivided solder joint structure comprising a plurality of subdivided solder paths between said mating contact pads, said solder joints being formed by embedding a plurality of solder wires longitudinally in an insulating matrix, deforming said insulating matrix so as to elongate said insulating matrix and to reduce the diameter of said plurality of solder wires, and cutting said elongated insulating matrix transverse to its longitudinal axis into slices, the length of said slices being determined by a spacing between said mating pads, said ratio between the length of each wire and its diameter being at least 2:1.

2. The device of claim 1, in which said ratio is at least 4:1.

3. The device of claim 1, in which said ratio is ≧30:1.

4. The device of claim 1, in which the length of each wire is within a range of from 1 to 500 mils 5. The device of claim 1, in which the diameter of each wire is ≦10 μm.

6. The device of claim 5, in which the diameter of each wire is ≦100 nanometers.

7. The device of claim 1, in which said solder paths number is at least 4 per contact pad.

8. The device of claim 7, in which said solder paths number is ≧30 per contact pad.

9. A method of fabricating an electronic device including interconnecting one component of said electronic device to another component of said device, said components having aligned mating contact pads, which comprises placing a thin electrically insulating body between the surfaces of said mating pads, said body being formed by embedding a plurality of solder wires longitudinally in an insulating matrix, deforming said insulating matrix so as to elongate said insulating matrix and to reduce the diameter of said plurality of solder wires, and cutting said elongated insulating matrix transverse to its longitudinal axis into slices to obtain said body, the length of said slices being determined by a spacing between said mating pads, and wherein the placement of the body is such that opposite ends of at least some of said plurality of solder wires contact the surfaces of the mating pads, at least two of said wires contacting each pair of said mating pads, and applying heat energy to fuse those ends of the wires to the pads which are being contacted by the wires.

10. The method of claim 9, in which the ratio between the length of each wire and its diameter is at least 2:1.

11. The method of claim 9, in which said ratio is at least 8:1.

12. The method of claim 9, in which said ratio is at least 30:1.

13. The method of claim 9, in which the diameter of each wire is ≦50 μm.

14. The method of claim 13 in which the diameter of each wire is ≦100 nanometers.

15. The method of claim 9, in which the length of each wire is within a range of from 1 to 500 mils.

16. A method of fabricating an electronic device including interconnecting one component of said electronic device to another component of said device, said components having aligned mating contact pads, which comprises placing a thin electrically insulating body between the surfaces of said mating pads, said body having a plurality of solder wires embedded in an insulating matrix such that opposite ends of at least some wires contact the surfaces of the mating pads, at least two of said wires contacting each pair of said mating pads, and applying heat energy to fuse those ends of the wires to the pads which are being contacted by the wires, and wherein said wires are formed by magnetically aligning solder-coated magnetic particles within a sheet of compliant or dissolvable matrix into a plurality of columns arranged transversely to the major surfaces of the sheet, and fusing the solder of individual particles forming continuously electrically conductive wires extending traversely of the sheet.

17. The method of claim 9, in which prior to said placing of the insulating body, the insulating matrix is removed from around the ends of the plurality of solder wires.

18. The method of claim 9, in which prior to said placing of the insulating body, the ends of the wires are built-up to project above the major surfaces of said body.

19. The method of claim 9, in which said matrix material is dissolved away and the elongated solder wires are further melted and fused.

20. A solder medium for interconnecting mating pads of circuit components, which comprises a sheet of an insulating matrix material and a plurality of solder-containing wires distributed throughout the matrix transversely to opposite major surfaces of the sheet, wherein said sheet is formed by embedding the plurality of solder-containing wires longitudinally in the insulating matrix, deforming said insulating matrix so as to elongate said insulating matrix and to reduce the diameter of said plurality of solder-containing wires, and cutting said elongated insulating matrix transverse to its longitudinal axis into slices, the length of said slices being determined by a spacing between said mating pads, each of said wires having a high-aspect of length-to-diameter ratio.

21. The solder medium of claim 20, in which said ratio is at least 2:1.

22. The solder medium of claim 20, in which said ratio is at least 8:1.

23. The solder medium of claim 20 in which said ratio is $\geq 30:1$.

24. The solder medium of claim 20, in which the length of each wire falls within a range of from 1 to 500 mils.

25. The solder medium of claim 20, in which the diameter of each wire is $\leq 50$ μm.

26. The solder medium of claim 25, in which said diameter is $\leq 100$ nanometers.

27. The solder medium of claim 20, in which the wires are distributed in a density allowing at least 2 solder connections per contact pad.

28. The solder medium of claim 27, in which said density of solder connections is $\geq 30$ per contact pad.

29. A method of preparing a solder medium for use in circuit interconnections wherein contact pads on one component of a circuit are connected to mating pads on another component of the circuit, which comprises forming an elongated body, said elongated body being formed by longitudinally embedding a plurality of solder wires in an electrically insulating plastically deformable matrix to form an embedded body, deforming the embedded body longitudinally so as to elongate the embedded body and to reduce the diameter of the solder wires, and cutting said elongated embedded body transverse to its longitudinal axis into slices the length of said slices being determined by a spacing between said mating contact pads.

30. The method of claim 29, in which the density of the solder wires in the slice is such that, when the slice is positioned between the components, there are at least two wires in contact with the mating contact pads.

31. The method of claim 29, in which the thickness of each slice ranges from 1 to 500 mils.

32. The method of claim 29, in which said deformation step is repeated at least once.

33. The method of claim 29, in which prior to said deforming step, said embedded body is combined with at least one more embedded body and embedded in a further volume of said plastically deformable matrix forming a larger embedded body.

34. The method of claim 33, in which the deformation of said larger embedded body is repeated at least once.

35. The method of claim 29, in which said longitudinally deformed body is combined with at least one more deformed body and embedded in a further amount of said plastically deformable matrix forming a combined embedded body, and deforming longitudinally the combined embedded body further.

36. The method of claim 35, in which said deformation of the combined embedded body is repeated at least once.

37. The method of claim 35, in which said formation and deformation of the combined embedded body is repeated at least once.

38. The method of claim 29, in which the ratio between the length of each wire and its diameter is at least 2:1.

39. The method of claim 38, in which said ratio is at least 8:1.

40. The method of claim 38, in which said ratio is $\geq 30:1$.

41. The method of claim 38, in which the diameter of each wire is $\leq 50$ μm.

42. The method of claim 41, in which the diameter of each wire is $\leq 100$ one nanometers.

43. A method of preparing a solder medium for use in circuit interconnections wherein contact pads on one component of a circuit are connected to mating pads on another component of the circuit, which comprises forming an elongated body having a plurality of elongated solder wires supported within a matrix of an insulating material, said wires extended longitudinally of the body and being separated each from another by said matrix, and cutting said elongated embedded body transverse to its longitudinally axis into slices, the length of said slices being determined by a spacing between said mating contact pads, and wherein said elongated body is formed by embedding a plurality of solder particles in a matrix of an electrically insulating material forming a composite structure into an elongated structure in which said particles are deformed into elongated wires or ribbons.

44. The method of claim 43, in which said elongated structure is combined with at least one more elongated structure and embedded in a further volume of said plastically deformable matrix forming an embedded body, and the embedded body is further deformed longitudinally so as to elongate the embedded body and to further reduce the diameter of the solder wires.

45. The method of claim 29, in which said matrix material is selected from plastically deformable materials and easily dissolvable materials.

46. The method of claim 45, in which said matrix material is selected from the group of compliant materials consisting of thermoplastic polymers, plasticized rubber and clay.

47. The method of claim 45, in which said matrix material is selected from the group of dissolvable materials consisting of gelatine, glucose, fructose and honey based materials, and of polyvinyl alcohol, polyacrylamide, polyvinyl pyrrolidinone, buthylvinyl alcohol and polyvinyl acetate.

* * * * *